United States Patent
Fujisawa et al.

(10) Patent No.: US 7,085,192 B2
(45) Date of Patent: Aug. 1, 2006

(54) SEMICONDUCTOR INTEGRATED CIRCUIT DEVICE

(75) Inventors: Hiroki Fujisawa, Tokyo (JP); Shuichi Kubouchi, Tokyo (JP)

(73) Assignees: Elpida Memory, Inc., Tokyo (JP); Hitachi Ulsi Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 11/004,796

(22) Filed: Dec. 7, 2004

(65) Prior Publication Data

US 2005/0122795 A1  Jun. 9, 2005

(30) Foreign Application Priority Data

Dec. 8, 2003  (JP) ............................. 2003-408729

(51) Int. Cl.
G11C 8/00 (2006.01)
(52) U.S. Cl. .................. 365/233; 365/230.08; 365/236
(58) Field of Classification Search ........... 365/230.08, 365/233, 236
See application file for complete search history.

(56) References Cited

U.S. PATENT DOCUMENTS 6,333,892 B1 * 12/2001 Hamamoto et al. .... 365/230.08
6,671,788 B1 * 12/2003 Shinozaki ................... 711/167

FOREIGN PATENT DOCUMENTS

| JP | 2000-276877 | 10/2000 |
| JP | 2002-25255 | 1/2002 |
| JP | 2002-133866 | 5/2002 |

* cited by examiner

Primary Examiner—Hoai V. Ho
(74) Attorney, Agent, or Firm—McGinn IP Law Group, PLLC (57) ABSTRACT

In a semiconductor integrated circuit device, a write command decoder decodes a write command and outputs decode pulses. A command counter circuit counts the decode pulses as the number of commands. A latch circuit latches the write aDDRess in response to a count output from the command counter circuit. A latency counter circuit counts a latency in response to the decode pulses. The semiconductor integrated circuit device further includes a circuit for turning on a column selection control signal when the count value of the latency counter circuit exceeds a predetermined latency value and a circuit for outputting the aDDRess latched by the latch circuit as a column aDDRess in response to the column selection control signal being turned on. The semiconductor integrated circuit device performs a write operation to the column aDDRess in response to the column selection control signal being turned on.

7 Claims, 11 Drawing Sheets

COLUMN ADDRESS LATCH IN DDR-I SDRAM

FIG. 3
RELATED ART
WAVEFORMS OF WRITE OPERATION IN DDR-II SDRAM (WL=8)

EXAMPLE OF DELAY FLIP-FLOP (D-F/F)

FIG. 7

EXAMPLE OF DELAY FLIP-FLOP (D-F/F)

FIG. 8

EXAMPLE OF OUTPUT SELECTOR

WAVEFORMS OF WRITE OPERATION IN DDR-II SDRAM
(WHEN INPUT-YS CONTROL (WL=8 (AL=4/CL=5)))

SEMICONDUCTOR INTEGRATED CIRCUIT DEVICE

This invention claims priority to prior Japanese patent application JP 2003-402102, the disclosure of which is incorporated herein by reference.

BACKGROUND OF THE INVENTION

1. Field of the Invention

The present invention relates to a semiconductor integrated circuit device having a synchronous dynamic random access memory (hereinafter referred to as an SDRAM), which is a DRAM operating in synchronization with a clock and, in particular, to a double data rate (hereinafter referred to as DDR) SDRAM.

2. Description of the Related Art

An SDRAM carries out an internal memory operation in synchronization with an external clock. A regular SDRAM receives and transmits one piece of data per clock cycle. In contrast, in a DDR SDRAM, a clock is divided so as to receive and transmit one piece of data at both the rising edge and falling edge of the clock. Accordingly, the DDR SDRAM has double the data rate compared to the regular SDRAM. The DDR SDRAM includes a DDR-I SDRAM and a DDR-II SDRAM, which is an advanced version of the DDR-I SDRAM.

In the DDR-I SDRAM, a write latency WL is a constant value of "1" (i.e., WL=1). The write latency WL refers to the number of clock cycles tCK required from a time when a write command and an aDDRess are input to a semiconductor integrated circuit device (chip) to a time when data to be written at the aDDRess is input to the semiconductor integrated circuit device (chip).

The DDR-II SDRAM, new standard, is allowed to include an additive latency AL, which is a variable value, as the write latency WL. This allows the write latency WL to vary up to its maximum value of 8. Also, this significantly increases the time period for holding an externally input aDDRess signal in the semiconductor integrated circuit device (chip), and therefore, this increases the number of required circuits. The increase in the number of circuits must be suppressed.

Figure 1:
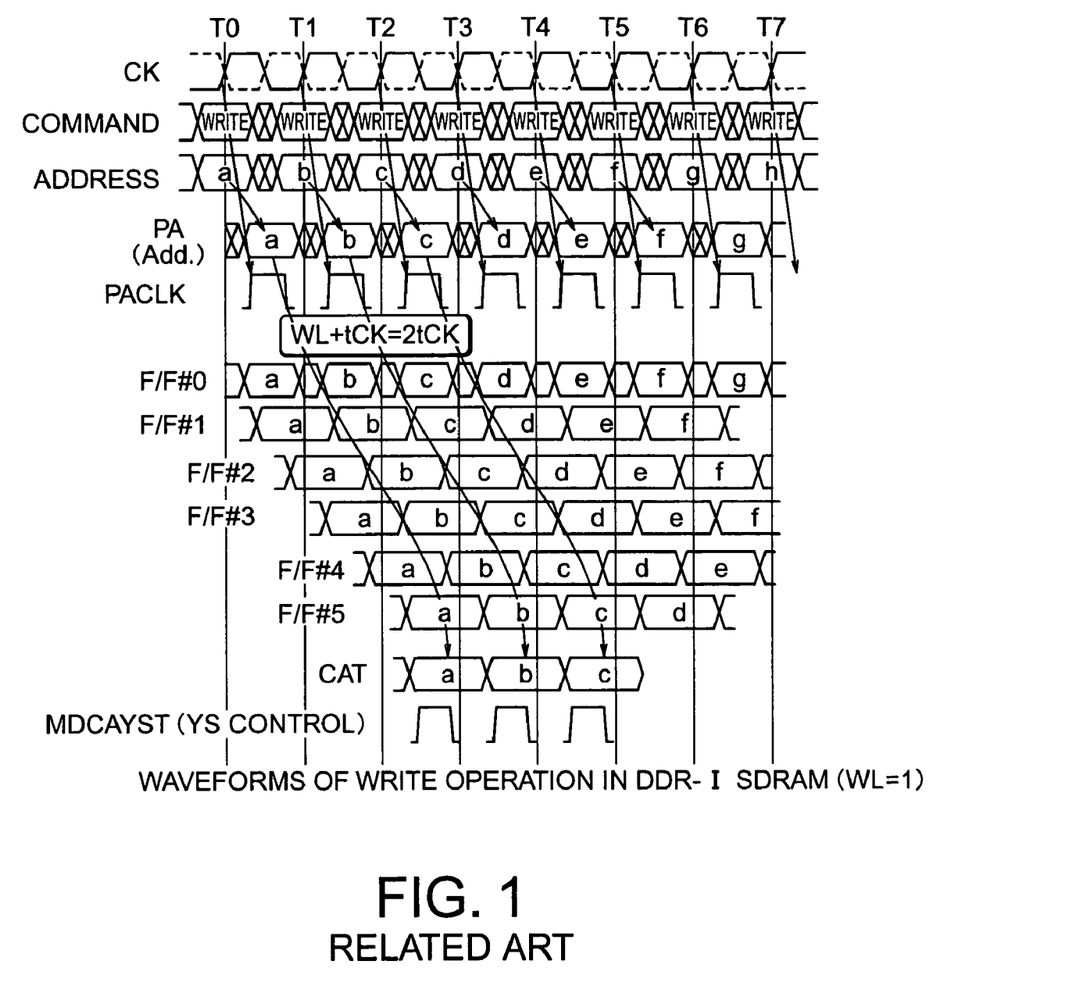
FIG. 1 is a timing diagram illustrating waveforms of a write operation in a DDR-I SDRAM, which is a semiconductor integrated circuit device of a first related art.

FIG. 1 shows waveforms of a write operation in a DDR-I SDRAM, which is a semiconductor integrated circuit device of a first related art.

Figure 2:
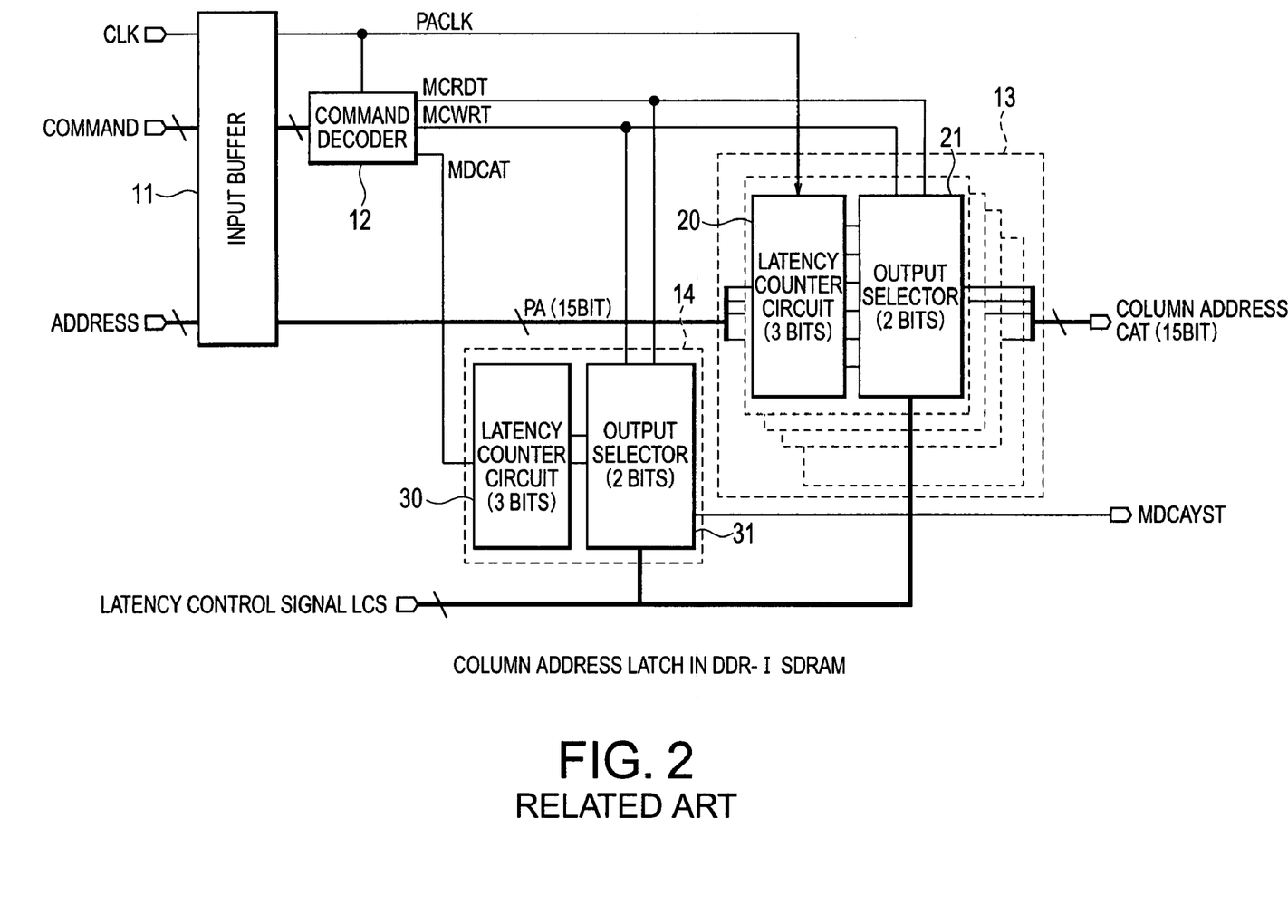
FIG. 2 is a block diagram of a DDR-I SDRAM, which is the semiconductor integrated circuit device of the first related art.

As shown in FIG. 2, the DDR-I SDRAM, which is a semiconductor integrated circuit device of the first related art, includes an input buffer 11 and a command decoder 12 connected to the input buffer 11. The input buffer 11 inputs a clock input CLK, a command, and an aDDRess and then outputs an aDDRess PA (refer to "PA" in FIG. 1) and a clock PACLK (refer to "PACLK" in FIG. 1). The command decoder 12 decodes a write command (WRITE in FIG. 1) received via the input buffer 11 and then outputs the decoded output MDCAT. A column aDDRess latch circuit 13 inputs the clock PACLK, the aDDRess PA, and a latency control signal LCS, latches the aDDRess PA, and outputs a column aDDRess CAT (refer to "CAT" in FIG. 1). A YS (Y Selection: column selection) latch circuit 14 inputs the decoded output MDCAT and the latency control signal LCS, latches the decoded output MDCAT, and outputs a YS (column selection) control signal MDCAYST (refer to "MDCAYST" in FIG. 1).

As described above, in FIG. 1, a DDR-I SDRAM has a write latency of constant value "1". Assuming that one clock cycle is represented by tCK, the DDR-I SDRAM has a waiting time including a clock cycle for inputting a write command WRITE into the chip and the subsequent one clock cycle (i.e., WL+tCK=2 tCK). In the subsequent one clock cycle, the DDR-I SDRAM writes data to a memory cell at an aDDRess input to the chip at the same time as input of the write command (WRITE). That is, in one clock cycle after 2 tCK (=WL+tCK) has elapsed, the data is written to the memory cell specified by the aDDRess. As a result, the aDDRess must be held for a period of 3 tCK including the clock cycle for writing the data to the memory cell specified by the aDDRess.

As shown in FIG. 2, to fulfill this requirement, the DDR-I SDRAM must include a 3-bit latency counter circuit 20 having six series-connected latch circuits (F/F #0, ..., F/F #5 in FIG. 1) per aDDRess.

The reason is as follows: In a DDR-I SDRAM, data is written to a memory cell after two clock cycles (constant value) have elapsed since the input of a write command into the chip. Therefore, the aDDRess for writing the data must be held in the chip until three clock cycles have elapsed since the input of the write command. In this case, if an aDDRess holding circuit is composed of D (delay) flip-flops (F/Fs) as described below, six D flip-flops are required as shown by F/F #0, ..., F/F #5 in FIG. 1. Two D flip-flops connected in series can hold an aDDRess for one clock cycle when the clock PACLK and an inverted phase of the clock PACLK are input. Here, a set of two D flip-flops (F/F) represents 1 bit and six D flip-flops (F/F) represent 3 bits.

As shown in FIG. 2, a 2-bit output selector 21 is connected to the output of the 3-bit latency counter circuit 20. The output selector 21 is controlled by the latency control signal LCS, a read control signal MCRDT, and a write control signal MCWRT so as to output the output of the latency counter circuit 20 as a column aDDRess CAT in response to different predetermined latencies in accordance with a read operation and a write operation.

The YS (column selection) latch circuit 14 includes a 3-bit latency counter circuit 30, which receives the decoded output MDCAT, and a 2-bit output selector 31. The 3-bit latency counter circuit 30 has the same configuration as the 3-bit latency counter circuit 20, while the 2-bit output selector 31 has the same configuration as the 2-bit output selector 21.

The output of the 3-bit latency counter circuit 30 is connected to the 2-bit output selector 31. The output selector 31 is controlled by the latency control signal LCS, the read control signal MCRDT, and the write control signal MCWRT so as to output the output of the latency counter circuit 30 as a YS control signal MDCAYST in response to different predetermined latencies in accordance with a read operation and a write operation.

Figure 3:
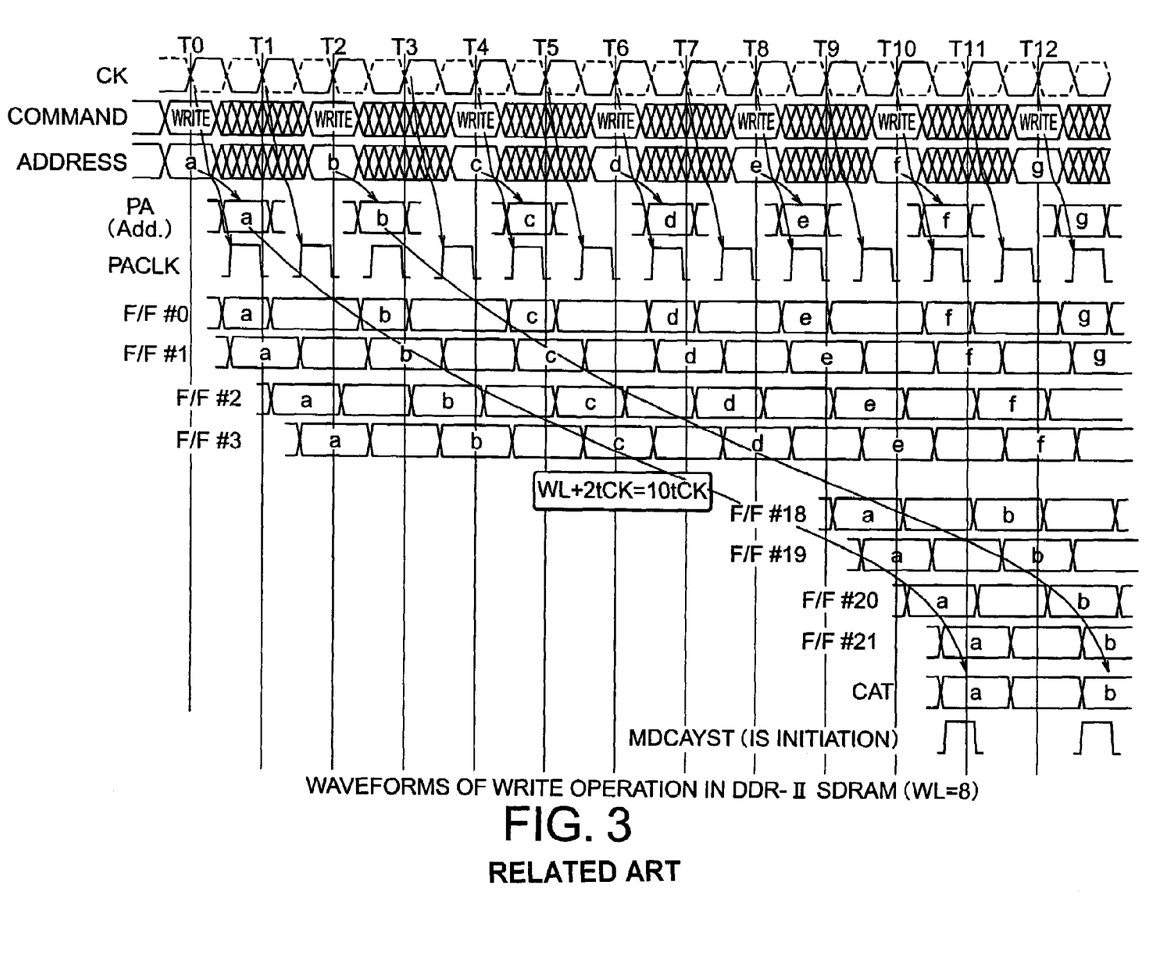
FIG. 3 is a timing diagram illustrating waveforms of a write operation in a DDR-II SDRAM, which is a semiconductor integrated circuit device of a second related art.

FIG. 3 shows waveforms of a write operation in a DDR-II SDRAM, which is a semiconductor integrated circuit device of a second related art.

Figure 4:
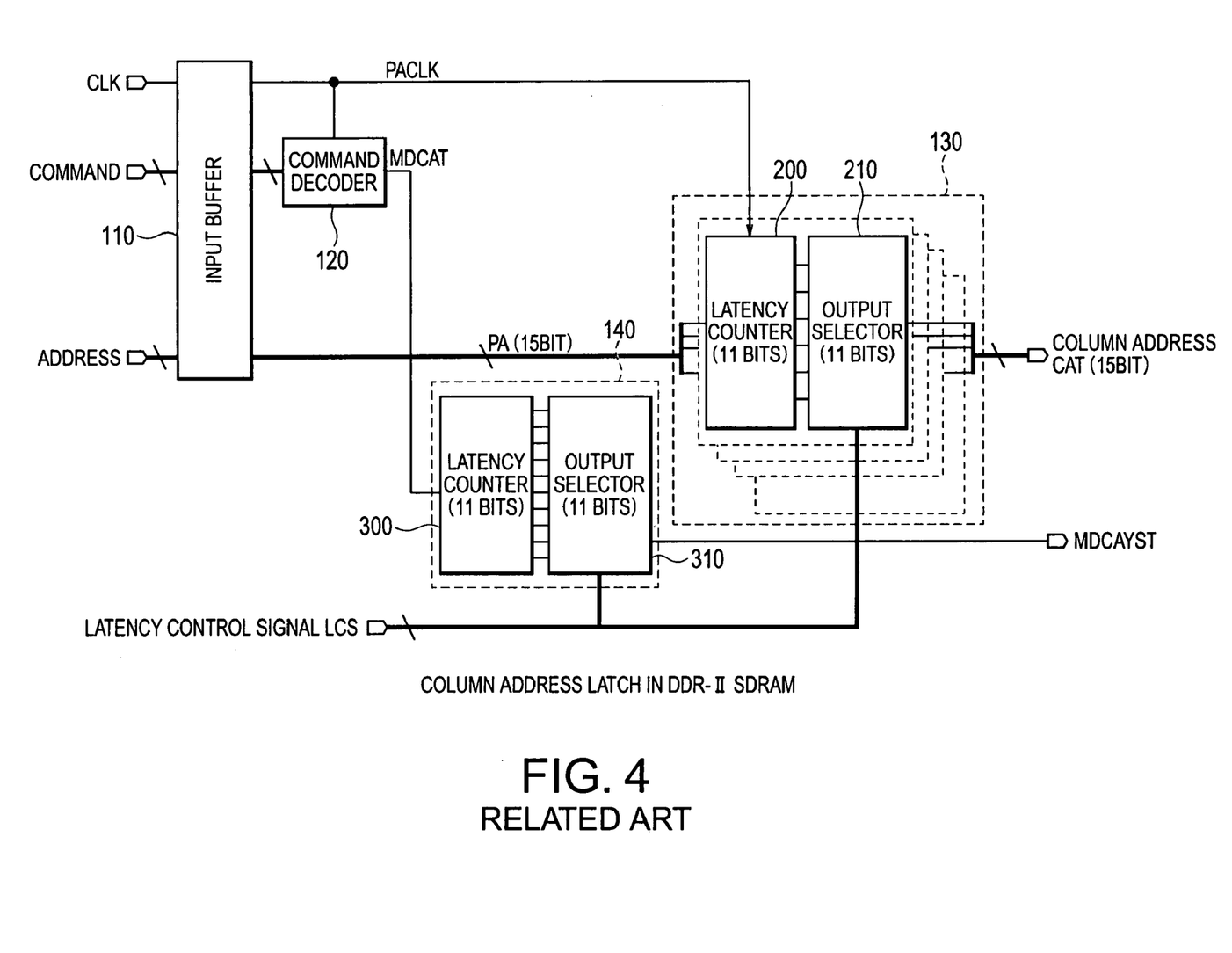
FIG. 4 is a block diagram of a DDR-II SDRAM, which is the semiconductor integrated circuit device of the second related art.

As shown in FIG. 4, the DDR-II SDRAM, which is a semiconductor integrated circuit device of the second related art, includes an input buffer 110 and a command decoder 120 connected to the input buffer 110. The input buffer 110 inputs a clock input CLK, a command, and an aDDRess and outputs an aDDRess PA (refer to "PA" in FIG. 3) and a clock PACLK (refer to "PACLK" in FIG. 3). The command decoder 120 decodes a write command ("WRITE" in FIG. 3) received via the input buffer 110 and then outputs a decoded output MDCAT. A column aDDRess latch circuit 130 inputs the clock PACLK, the aDDRess PA, and a latency control signal LCS, latches the aDDRess PA, and outputs a column aDDRess CAT (refer to "CAT" in FIG. 3). A YS (column selection) latch circuit 140 inputs the decoded output MDCAT and the latency control signal LCS, latches the decoded output MDCAT, and outputs a YS (column selection) control signal MDCAYST (refer to "MDCAYST" in FIG. 3).

FIG. 3 shows operational waveforms indicating the waveforms from the input signals to the chip (DDR-II SDRAM) to the YS (column selection) initiation signal. The DDR-II SDRAM adopts a new method known as Posted/CAS (Column ADDRess Strobe) and an additive latency AL is added as a parameter of the method. The suffix "/CAS" represents a column aDDRess strobe. The Posted/CAS method allows a column command such as READ and WRITE to be input to the chip in advance. After a predetermined latency set for AL has elapsed, the READ or WRITE command is issued inside the chip. In addition, the write latency WL has a variable value determined by AL and a /CAS latency CL. Here, the write latency WL can be expressed as WL=(AL+CL−1). When AL=4 and CL=5, the current maximum value of the write latency WL is 8 (i.e., WL=AL+CL−1=4+5−1).

In the DDR-II SDRAM, data is written to a memory cell at a specified aDDRess after (WL+2 tCK) clock cycles have elapsed since the input of a write command into the chip. For example, when the write latency WL is 8 (i.e., WL=8), the operation is as follows. The DDR-II SDRAM has a waiting time including 8 (=WL) clock cycles from a first clock cycle for inputting a write command WRITE into the chip to an eighth clock cycle and 2 clock cycles (2 tCK) subsequent to the eighth clock cycle. In the subsequent one clock cycle, the DDR-II SDRAM writes data to a memory cell at the aDDRess input to the chip at the same time as input of the write command WRITE. That is, in one clock cycle after 10 tCK (=WL+2 tCK) has elapsed, the data is written to the memory cell specified by the aDDRess. As a result, the aDDRess must be held for a period of 11 tCK including the clock cycle for writing the data to the memory cell specified by the aDDRess.

As shown in FIG. 4, to fulfill this requirement, the DDR-II SDRAM must include an 11-bit latency counter circuit 200 having 22 series-connected latch circuits (F/F #0, . . . , F/F #21 in FIG. 3) per aDDRess, thus significantly increasing the number of circuits.

The reason is as follows: The DDR-II SDRAM requires a maximum of 11 clock cycles, which is a current specification, from the input of a write command into the chip to the data writing to a memory cell. Therefore, the aDDRess must be held in the chip for 11 clock cycles.

If an aDDRess holding circuit is composed of the above-described D (delay) flip-flops (F/Fs), 22 D flip-flops are required, as shown by F/F #0, . . . , F/F #21 in FIG. 3. In addition, since the number of D flip-flops must be variable, additional circuits are required to change the number of D flip-flops.

As shown in FIG. 4, the outputs of the 11-bit latency counter circuit 200 are connected to an 11-bit output selector 210. The output selector 210 is controlled by a latency control signal LCS to output the output of the latency counter circuit 200 as a column aDDRess CAT.

The YS (column selection) latch circuit 140 includes an 11-bit latency counter circuit 300, which receives the decoded output MDCAT, and an 11-bit output selector 310. The 11-bit latency counter circuit 300 has the same configuration as the 11-bit latency counter circuit 200, while the 11-bit output selector 310 has the same configuration as the 11-bit output selector 210.

The outputs of the 11-bit latency counter circuit 300 are connected to the 11-bit output selector 310. The output selector 310 is controlled by the latency control signal LCS so as to output the output of the latency counter circuit 300 as a YS control signal MDCAYST.

Additionally, Japanese Unexamined Patent Application Publication No. 2000-276877 discloses an SDRAM having a posted CAS latency function as an SDRAM related to the two above-described related arts. Furthermore, Japanese Unexamined Patent Application Publication No. 2002-25255 discloses a double data rate SDRAM and Japanese Unexamined Patent Application Publication No. 2002-133866 discloses an SDRAM having a posted CAS function.

SUMMARY OF THE INVENTION

Accordingly, it is an object of the present invention to provide a semiconductor integrated circuit device having a simple circuit configuration.

In accordance with a first embodiment of the present invention, a semiconductor integrated circuit device receives a command and an aDDRess. The semiconductor integrated circuit device includes a command decoder for decoding the command and outputting decode pulses, a command counter circuit for counting the decode pulses as the number of commands, a latch circuit for latching the aDDRess in response to a count output from the command counter circuit, a latency counter circuit for counting a latency in response to the decode pulses, a first output circuit for turning on a column selection control signal when the count value of the latency counter circuit exceeds a predetermined latency value, and a second output circuit for outputting the aDDRess latched by the latch circuit as a column aDDRess in response to the column selection control signal being turned on.

In accordance with a second embodiment of the present invention, a semiconductor integrated circuit device receives a write command and a write aDDRess. The semiconductor integrated circuit device includes a write command decoder for decoding the write command and outputting decode pulses, a command counter circuit for counting the decode pulses as the number of commands, a latch circuit for latching the write aDDRess in response to a count output from the command counter circuit, a latency counter circuit for counting a latency in response to the decode pulses, a first output circuit for turning on a column selection control signal when the count value of the latency counter circuit exceeds a predetermined latency value, and a second output circuit for outputting the aDDRess latched by the latch circuit as a column aDDRess in response to the column selection control signal being turned on. The semiconductor integrated circuit device carries out a write operation to the column aDDRess in response to the column selection control signal being turned on.

In accordance with a third embodiment of the present invention, a semiconductor integrated circuit device receives a read command and a read aDDRess. The semiconductor integrated circuit device includes a read command decoder for decoding the read command and outputting decode pulses, a command counter circuit for counting the decode pulses as the number of commands, a latch circuit for latching the read aDDRess in response to a count output from the command counter circuit, a latency counter circuit for counting a latency in response to the decode pulses, a first output circuit for turning on a column selection control signal when the count value of the latency counter circuit exceeds a predetermined latency value, and a second output circuit for outputting the aDDRess latched by the latch circuit as a column aDDRess in response to the column selection control signal being turned on. The semiconductor integrated circuit device carries out a read operation to the column aDDRess in response to the column selection control signal being turned on.

DESCRIPTION OF THE PREFERRED EMBODIMENTS

Embodiments of the present invention will now be described with reference to the accompanying drawings.

In a DDR-II SDRAM according to the present invention, the number of prefetch bits is changed. A DDR-I SDRAM has two prefetch bits, while the DDR-II SDRAM has four prefetch bits. Also, along with this change, the minimum input interval of a column command is changed from 1 tCK for the DDR-I SDRAM to 2 tCK. According to the present invention, using these changes, a new method is proposed in which an aDDRess is latched only when a command is input. In other words, in the above-described related arts, an aDDRess is latched using an internal clock produced at every cycle generated by an external clock.

Figure 5:
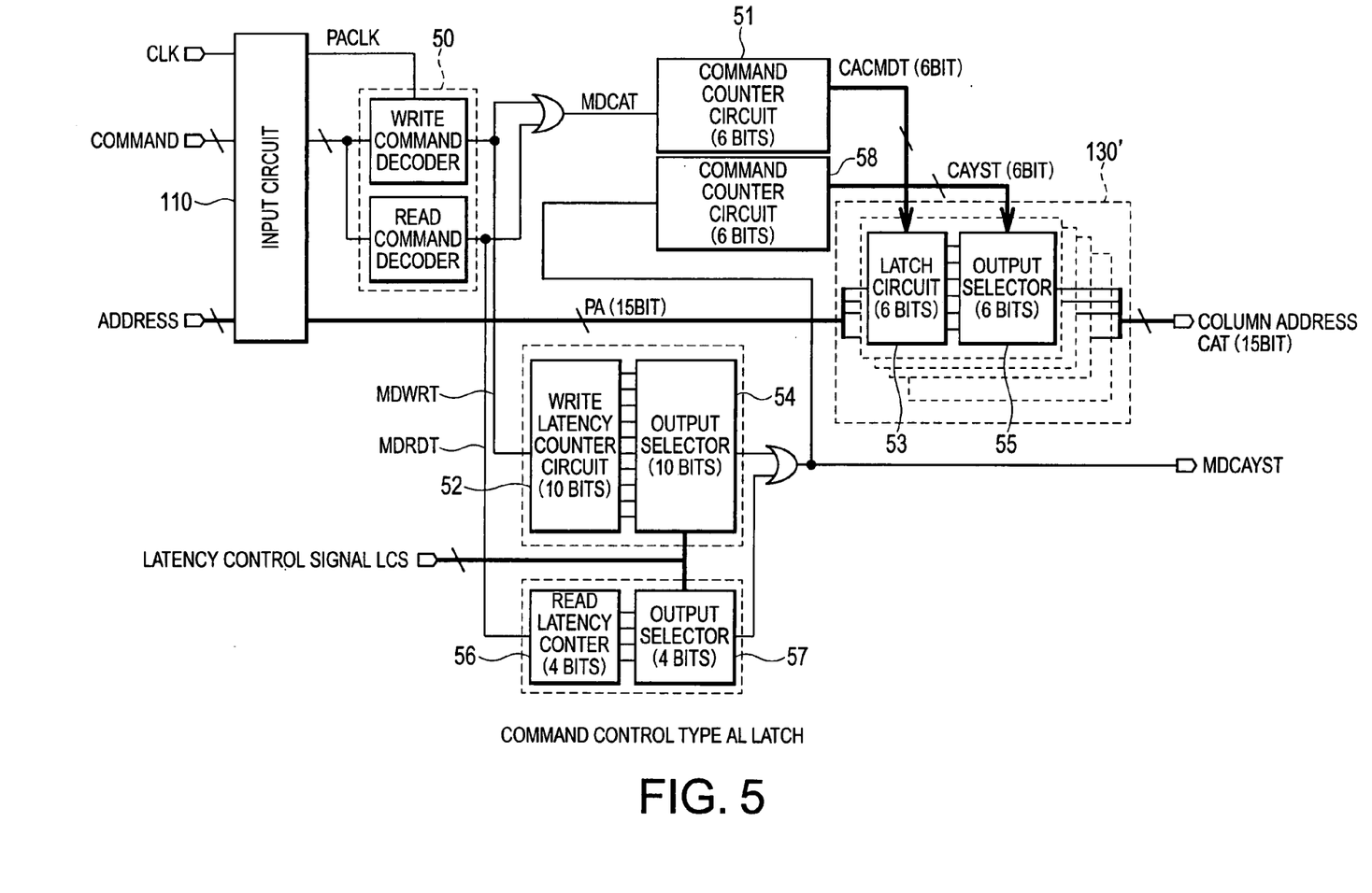
FIG. 5 is a block diagram of a semiconductor integrated circuit device according to an embodiment of the present invention.

FIG. 5 shows a semiconductor integrated circuit device according to an embodiment of the present invention. This semiconductor integrated circuit device is a DDR-II SDRAM.

As shown in FIG. 5, the DDR-II SDRAM according to the embodiment includes a command counter circuit 51. Also, the DDR-II SDRAM according to the embodiment includes a latency counter circuit 52 and an output selector 54 outside a column aDDRess latch circuit 130'. The column aDDRess latch circuit 130' includes a latch circuit 53 and an output selector 55. This configuration reduces the number of circuits and decreases the operating frequency of the aDDRess latch circuit, thus reducing the layout area and power consumption.

A DDR-II SDRAM shown in FIG. 4 has a latency counter for each aDDRess. In contrast, the DDR-II SDRAM according to the embodiment has the latency counter circuit 52 outside the column aDDRess latch circuit 130' in order to reduce the number of circuits. In other words, in the DDR-II SDRAM shown in FIG. 4, aDDRess latches are linked together and a latency (an internal clock delay) is sequentially transferred by clock control. In this embodiment, the latency counter circuit 52 is moved out of the latch circuit 53 and the latency counter circuit 52 that counts one set of latencies is located outside the column aDDRess latch circuit 130'.

A latch circuit shown in FIG. 4 receives an aDDRess for every cycle by using an internal clock generated by an external aDDRess. In contrast, in this embodiment, a command decoder circuit 50 detects an externally input command and the command counter circuit 51 counts the detected commands. By using the resultant count from the command counter circuit 51, one of a plurality of the latch circuits 53 is sequentially selected to input a series of aDDResses. The aDDResses are retrieved in the following manner. A command detected by the command decoder circuit 50 is passed through the latency counter circuit 52 to generate pulses that are delayed for a desired number of cycles. The generated pulses are counted by a command counter 58. By using the resultant count from the command counter 58, the output selector 55 sequentially selects an output of the latch circuit 53. Since, in the DDR-II specification, a minimum interval of column commands is 2 clocks, this configuration allows the operating frequency of the aDDRess latch circuit to be less than or equal to half the operating frequency of a known latch circuit, thus reducing the layout area and power consumption.

Figure 6:
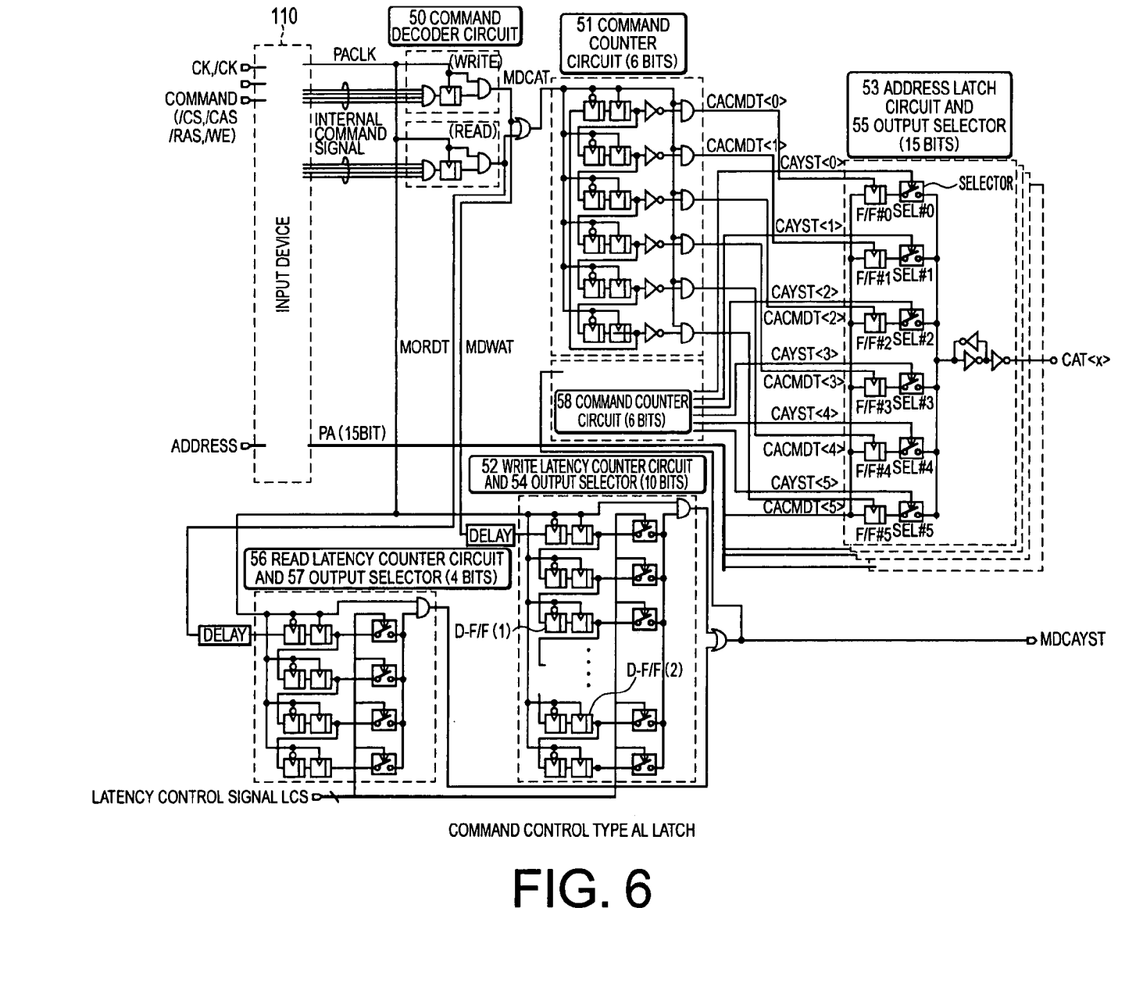
FIG. 6 is a block diagram of a specific example of the semiconductor integrated circuit device shown in FIG. 5.
Figure 7:
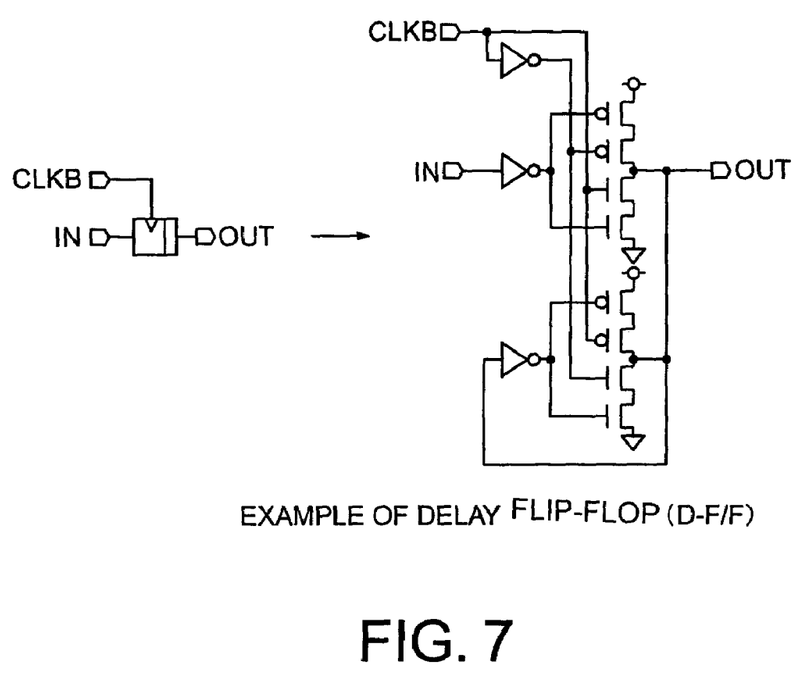
FIG. 7 shows an example of a circuit of a D-F/F (1) shown in FIG. 6.
Figure 8:
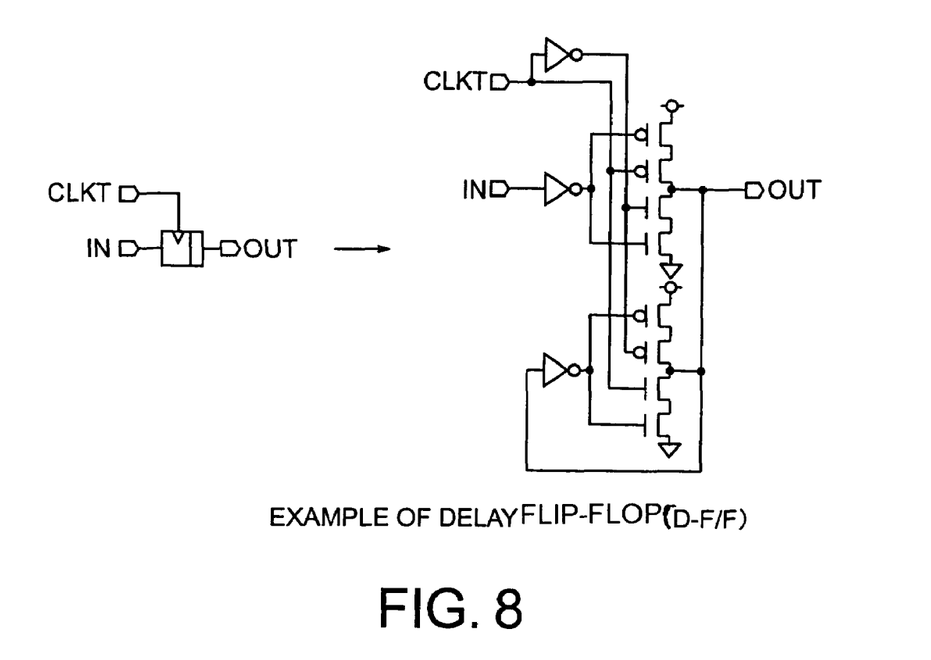
FIG. 8 shows an example of a circuit of a D-F/F (2) shown in FIG. 6.
Figure 9:
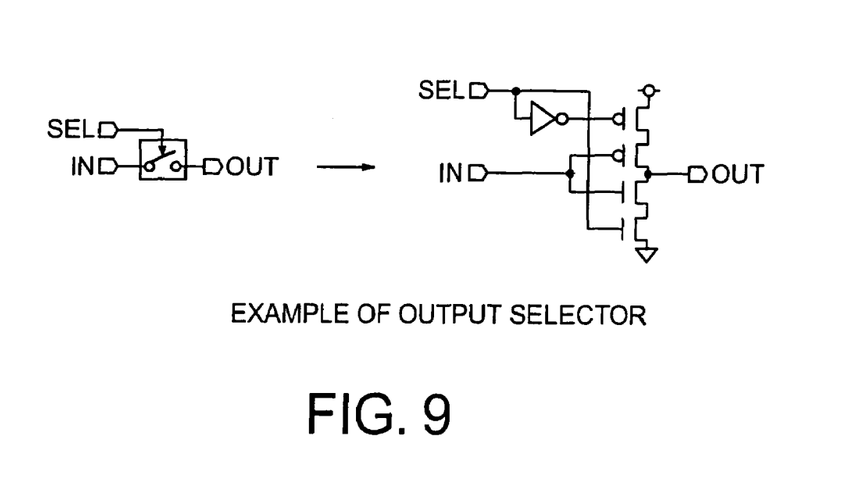
FIG. 9 shows an example of a circuit of a selector shown in FIG. 6.

FIG. 6 shows a detailed example of the DDR-II SDRAM shown in FIG. 5 using a delay flip-flop (D-F/F). Delay flip-flops D-F/F(1) and D-F/F(2) are configured with, for example, the circuits shown in FIGS. 7 and 8. A selector shown in FIG. 6 is configured with, for example, a circuit shown in FIG. 9. In FIGS. 7 to 9, the left-side circuit represents the corresponding circuit shown in FIG. 6 while the right-side circuit represents the details thereof.

As shown in FIG. 6, the command decoder circuit 50 decodes an externally input command signal to detect a column command (i.e., a READ command or a WRITE command).

The command counter circuit 51 shifts an output bit by one bit every time a pulse is input.

Latency counter circuits include a WRITE latency counter circuit 52 and a READ latency counter circuit 56, which count required latencies after the column command is input. A pulse is generated after the required latencies.

The aDDRess latch circuit 53 holds an aDDRess for the required number of cycles in response to a signal from the command counter circuit 51.

The operation of this detailed example will be described below. Firstly, a write operation of the DDR-II SDRAM from an input to YS (column selection) initiation will be briefly described with reference to operating waveforms shown in FIG. 10. Compared to a DDR-I SDRAM, a DDR-II SDRAM employs a new method known as the Posted/CAS (Column ADDRess Strobe) and an active latency (AL) is added as a parameter of the method. Additionally, a write latency (WL), which is a constant value of "1" for a DDR-I SDRAM, becomes a variable value determined by the active latency (AL) and a /CAS latency (CL). The Posted/CAS method allows a column command to be input into a chip in advance. The active latency (AL) is a parameter that determines how many clocks are required before the externally input column command becomes active in a chip. The write latency (WL) is a parameter that determines how many clocks are required from a time when a column command is externally input to a time when write data is input to the chip.

Figure 10:
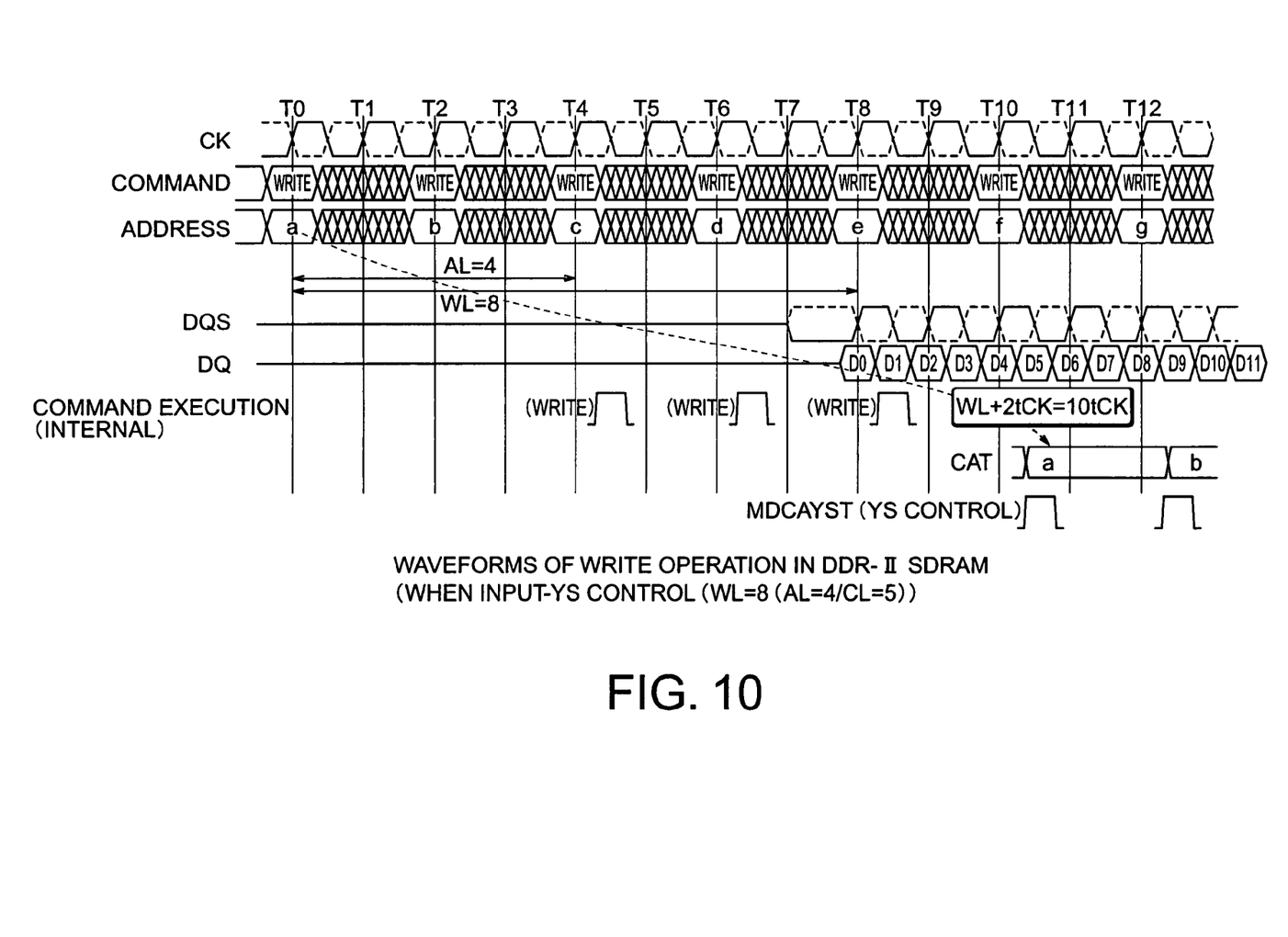
FIG. 10 is a timing diagram illustrating waveforms of a write operation in the semiconductor integrated circuit device shown in FIG. 6.

FIG. 10 is a schematic diagram of operating waveforms of a write operation in the case of AL=4 (a maximum value) and CL=5 (a maximum value). FIG. 10 shows waveforms starting from an input signal to the chip to a YS control signal for controlling a write operation to a memory cell. In this case, since a write latency (WL) of the DDR-II SDRAM is a maximum value of 8 (i.e., WL=AL+CL−1=4+5−1), write data DQ and data strobe signals DQS and /DQS are provided to the chip after 8 tCK has elapsed since a command is input.

Since the DDR-II SDRAM is in a 4-bit prefetch mode, data must be written to the memory cell in a clock cycle after 4-bit data D0 to D3 are input (2 tCK are required for a DDR). That is, the chip must hold an aDDRess for a time period of 10 tCK starting from the command input (i.e., WL (=8)+2 tCK=10 tCK) and a time period of 1 tCK required for data writing to the memory cell, i.e., for the total of 11 tCK.

The operation of the DDR-II SDRAM shown in FIG. 6 will be described in detail with reference to internal operation waveforms shown in FIG. 11.

Figure 11:
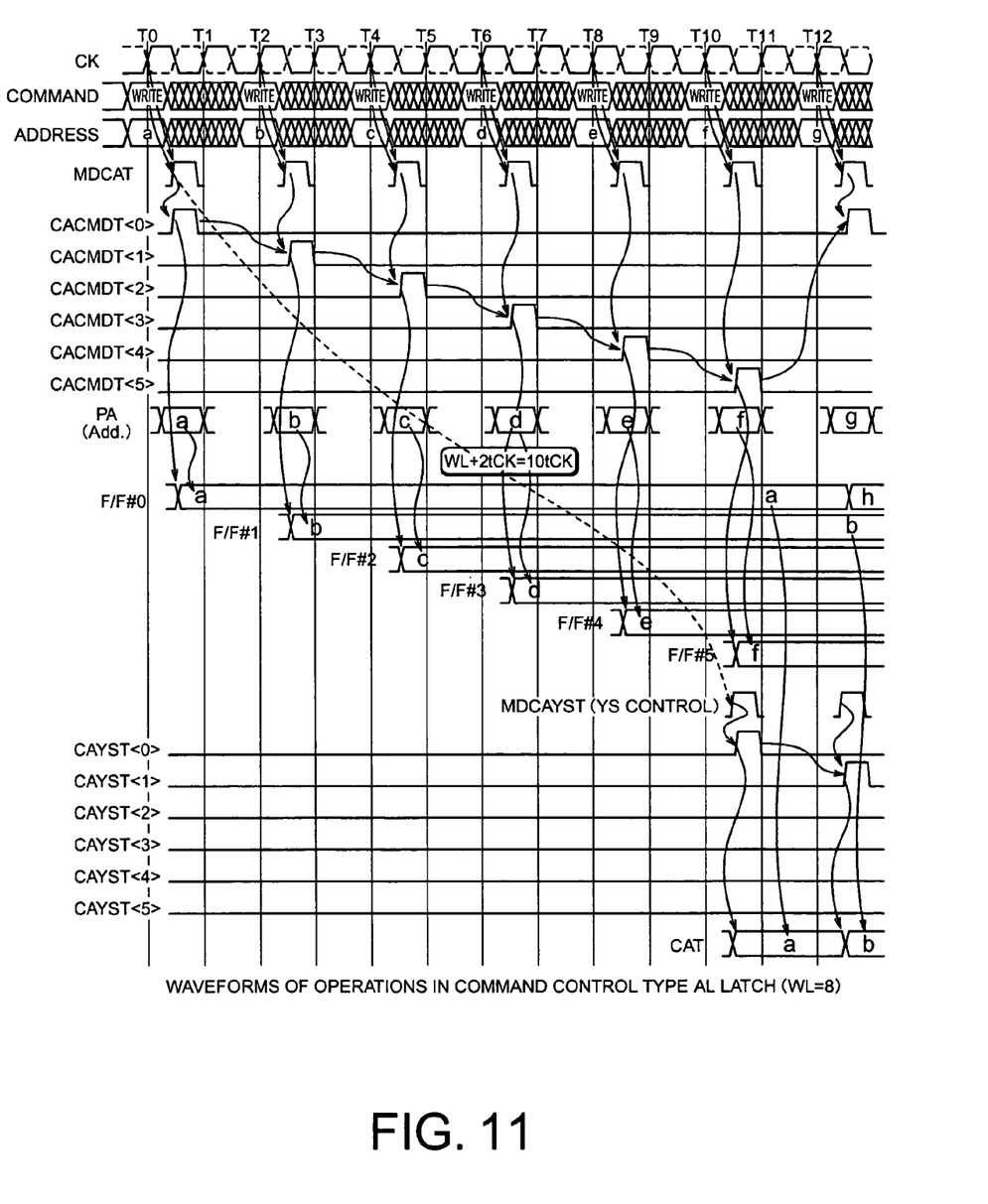
FIG. 11 is a timing diagram illustrating waveforms of another operation in the semiconductor integrated circuit device shown in FIG. 6.

FIG. 11 is a diagram of waveforms of internal signals related to the operation of a command-controlled AL latch circuit according to the present invention.

Here, a write operation will be described. An input circuit (input buffer) 110 receives, from outside the chip, a command signal, such as /CS (Chip Select), /RAS (Row ADDRess Strobe), and /WE (Write Enable), and an aDDRess signal in synchronization with clocks CK and /CK. Upon receipt of these signals, the input circuit (input buffer) 110 generates an internal clock signal PACLK, an internal command signal, and an internal aDDRess signal PA to control the internal circuits of the chip.

The command decoder circuit 50 decodes the internal command signal to detect a write command input externally. Upon detection of the write command, the command decoder circuit 50 generates a pulse signal MDCAT, which is input to the command counter circuit 51.

The command counter circuit 51 is composed of a 6-bit shift register. The command counter 58 is also composed of a 6-bit shift register.

In FIG. 6, a reset circuit of a flip-flop is not shown. When a pulse is input, a pulse of only one bit is output among 6 bit outputs CACMDT <0> to <5>. Every time a pulse is input, the output pulse is shifted to a higher-order bit.

Subsequently, each of the output bits CACMDT <0> to <5> of the command counter circuit 51 is connected to each of the six latch circuits 53 arranged for one internal aDDRess signal PA on a one-to-one basis. The same internal aDDRess signal PA is input to the six latch circuits 53. That is, one of the latch circuits 53 is sequentially selected by one of the CACMDT <0> to <5> issued every time a write command is input, and therefore, the internal aDDRess signal PA can be latched.

A signal MDWRT generated at the time where the write command is input is also input to the latency counter circuit 52. The latency counter circuit 52 is composed of a 10-bit shift register and is controlled by an internal clock signal PACLK. In this embodiment, the rising edge of the internal clock signal PACLK shifts the outputs of 10 bits. The outputs are connected to the output selectors 54. One out of 10 bits is selected in accordance with the write latency (WL) set in the chip and is output. When the write latency WL=8, only the 10th bit is selected. After 10 tCK has elapsed since the decoded output MDCAT from the command decoder circuit 50 is input, a pulse signal MDCAYST is generated.

The pulse signal MDCAYST controls a YS (column selection) switch for writing data to the memory cell. The pulse signal MDCAYST is also used to retrieve a desired aDDRess held inside the chip from the latch circuit 53 at the same timing as the pulse signal MDCAYST. The pulse signal MDCAYST is input to another command counter 58 having the same configuration as the above-described command counter circuit 51.

That is, the command counter 58 sequentially shifts the 6 bit outputs of CAYST <0> to <5> and outputs them every time the pulse signal MDCAYST is input.

The 6 bit signals are input to the output selectors 55, which are downstream of the latch circuits 53, on a one-to-one basis. Therefore, the aDDResses are output in the same order as they are input. Thus, the aDDRess latch circuit controlled by a command input from outside the chip is achieved.

Figure 12:
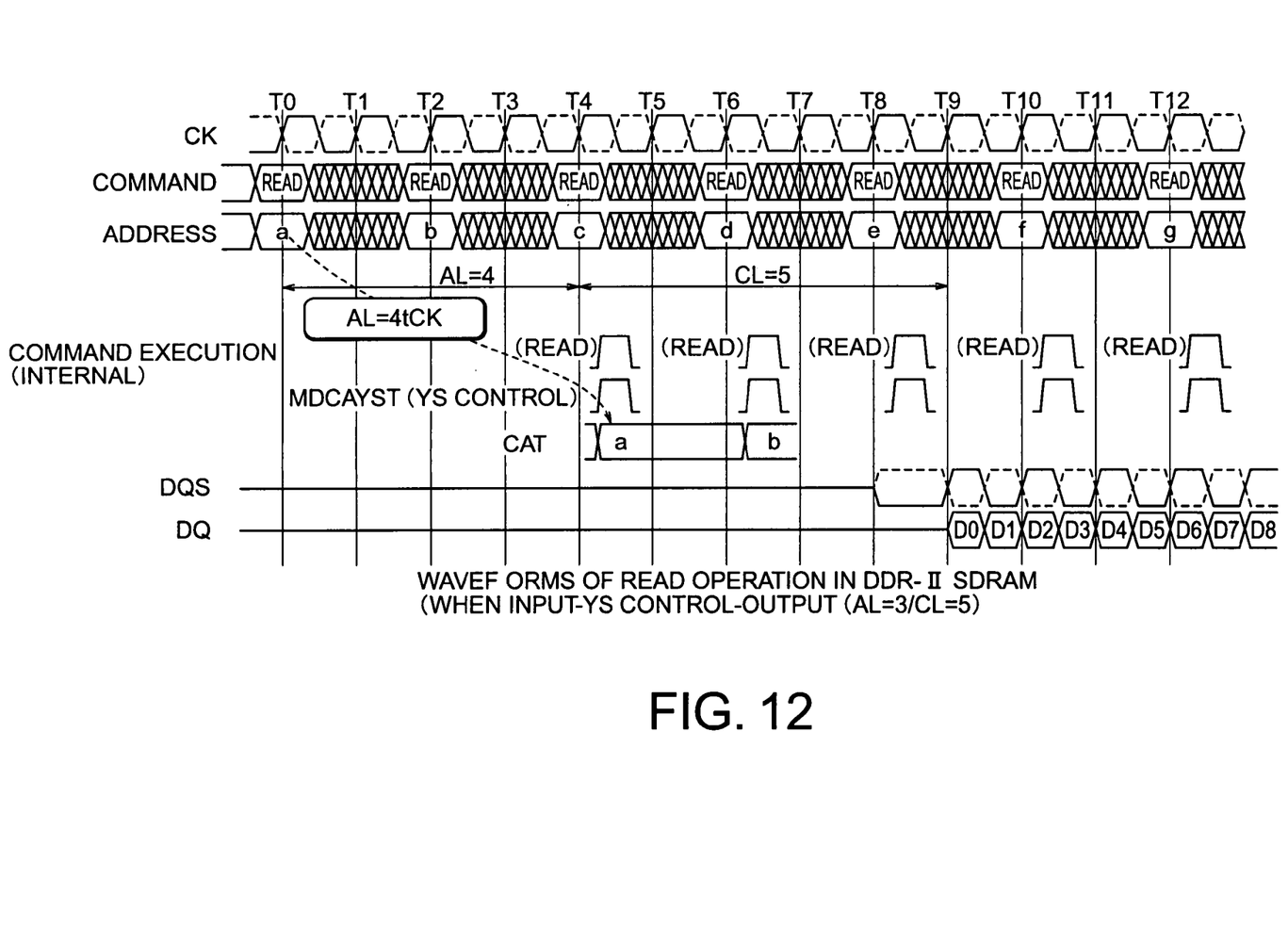
FIG. 12 is a timing diagram illustrating waveforms of still another operation in the semiconductor integrated circuit device shown in FIG. 6.

When a read command is input, the same operation is carried out. However, since, as shown in FIG. 12, the YS (column selection) control of the read operation is carried out after cycles of the additive latency AL (=4 tCK), another latency counter 56 and another output selector 57 are disposed for the read operation.

As described above, according to the present invention, only one latency counter is disposed while the DDR-II SDRAM shown in FIG. 4 has a latency counter for each aDDRess. In addition, while an aDDRess is input at every cycle by using an internal clock in the method shown in FIG. 4, the aDDRess is only input at a column command input time. This results in half the operating frequency of that in the method shown in FIG. 4 since, in a DDR-II SDRAM, the minimum interval between column commands is 2 tCK.

The numbers of flip-flops and the output selectors 55 used in the command counter circuit 51, the latency counter circuit 52, and the latch circuit 53 can be reduced to about one-half those in the known DDR-II SDRAM, that is, from 528 to 246. Consequently, the layout area can be reduced to one half.

Since the operating frequency of the latch circuit 53 is decreased to half and a latency counter disposed for each aDDRess is eliminated, the consumption current can be significantly reduced.

The embodiments of the present invention will be listed below with reference to FIG. 5.

(1) A semiconductor integrated circuit device receives a write command and a write aDDRess and includes a write command decoder, which is one of the decoders in a block 50 shown in FIG. 5, for decoding the write command and outputting decode pulses; a command counter circuit 51 for counting the decode pulses as the number of commands; a latch circuit 53 for latching the write aDDRess in response to a count output from the command counter circuit 51; a latency counter circuit 52 for counting a latency in response to the decode pulses; an output selector 54 for turning on a column selection control signal MDCAYST when the count value of the latency counter circuit 52 exceeds a predetermined latency value; another output selector 55 for outputting the aDDRess latched by the latch circuit 53 as a column aDDRess CAT in response to the column selection control signal MDCAYST being turned on, wherein a write operation to the column aDDRess CAT is carried out in response to the column selection control signal MDCAYST being turned on.

(2) A semiconductor integrated circuit device receives a read command and a read aDDRess and includes a read command decoder, which is the other decoder in a block 50 shown in FIG. 5, for decoding the read command and outputting decode pulses; a command counter circuit 51 for counting the decode pulses as the number of commands; a latch circuit 53 for latching the read aDDRess in response to a count output from the command counter circuit 51; a latency counter circuit 56 for counting a latency in response to the decode pulses; an output selector 57 for turning on a column selection control signal MDCAYST when the count value of the latency counter circuit 56 exceeds a predetermined latency value; and another output selector 55 for outputting the aDDRess latched by the latch circuit 53 as a column aDDRess CAT in response to the column selection control signal MDCAYST being turned on, wherein a read operation to the column aDDRess CAT is carried out in response to the column selection control signal MDCAYST being turned on.

(3) The semiconductor integrated circuit device according to the above-described (1) or (2) is characterized in that the semiconductor integrated circuit device is a DDR-II SDRAM.

As described above, the present invention can provide a semiconductor integrated circuit device having a simple circuit configuration.

What is claimed is:

1. A semiconductor integrated circuit device receiving a command and an aDDRess, comprising:
   a command decoder for decoding the command and outputting decode pulses;
   a command counter circuit for counting the decode pulses as the number of commands;
   a latch circuit for latching the aDDRess in response to a count output from the command counter circuit;
   a latency counter circuit for counting a latency in response to the decode pulses;
   a first output circuit for turning on a column selection control signal when the count value of the latency counter circuit exceeds a predetermined latency value; and
   a second output circuit for outputting the aDDRess latched by the latch circuit as a column aDDRess in response to the column selection control signal being turned on.

2. The semiconductor integrated circuit device according to claim 1, wherein the command is one of a write command and a read command.

3. The semiconductor integrated circuit device according to claim 1, wherein the semiconductor integrated circuit device is a DDR-II SDRAM.

4. A semiconductor integrated circuit device receiving a write command and a write aDDRess, comprising:
   a write command decoder for decoding the write command and outputting decode pulses;
   a command counter circuit for counting the decode pulses as the number of commands;
   a latch circuit for latching the write aDDRess in response to a count output from the command counter circuit;
   a latency counter circuit for counting a latency in response to the decode pulses;
   a first output circuit for turning on a column selection control signal when the count value of the latency counter circuit exceeds a predetermined latency value; and
   a second output circuit for outputting the aDDRess latched by the latch circuit as a column aDDRess in response to the column selection control signal being turned on;
   wherein a write operation to the column aDDRess is carried out in response to the column selection control signal being turned on.

5. The semiconductor integrated circuit device according to claim 4, wherein the semiconductor integrated circuit device is a DDR-II SDRAM.

6. A semiconductor integrated circuit device receiving a read command and a read aDDRess, comprising:
   a read command decoder for decoding the read command and outputting decode pulses;
   a command counter circuit for counting the decode pulses as the number of commands;
   a latch circuit for latching the read aDDRess in response to a count output from the command counter circuit;
   a latency counter circuit for counting a latency in response to the decode pulses;
   a first output circuit for turning on a column selection control signal when the count value of the latency counter circuit exceeds a predetermined latency value; and
   a second output circuit for outputting the aDDRess latched by the latch circuit as a column aDDRess in response to the column selection control signal being turned on;
   wherein a read operation to the column aDDRess is carried out in response to the column selection control signal being turned on.

7. The semiconductor integrated circuit device according to claim 6, wherein the semiconductor integrated circuit device is a DDR-II SDRAM.

* * * * *